(12) United States Patent
Li et al.

(10) Patent No.: US 11,177,425 B2
(45) Date of Patent: Nov. 16, 2021

(54) DRIVING BACKPLANE, METHOD FOR MANUFACTURING THE SAME, AND DISPLAY DEVICE

(71) Applicants: Ordos Yuansheng Optoelectronics Co., Ltd., Ordos, Inner Mongolia (CN); BOE TECHNOLOGY GROUP CO., LTD., Beijing (CN)

(72) Inventors: Feng Li, Beijing (CN); Yezhou Fang, Beijing (CN)

(73) Assignees: Ordos Yuansheng Optoelectronics Co., Ltd., Ordos (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/827,307

(22) Filed: Mar. 23, 2020

(65) Prior Publication Data
US 2021/0050497 A1 Feb. 18, 2021

(30) Foreign Application Priority Data
Aug. 15, 2019 (CN) .......................... 201910753290.X

(51) Int. Cl.
*H01L 33/62* (2010.01)
*H01L 25/075* (2006.01)
*H01L 33/00* (2010.01)

(52) U.S. Cl.
CPC .......... *H01L 33/62* (2013.01); *H01L 25/0753* (2013.01); *H01L 33/0095* (2013.01); *H01L 2933/0066* (2013.01)

(58) Field of Classification Search
CPC combination set(s) only.
See application file for complete search history.

(56) References Cited

U.S. PATENT DOCUMENTS

| | | | |
|---|---|---|---|
| 2014/0296673 A1* | 10/2014 | Etzkorn | A61B 3/10 600/345 |
| 2016/0240480 A1* | 8/2016 | Lin | H01L 25/50 |
| 2018/0122914 A1 | 5/2018 | Li et al. | |
| 2019/0074206 A1 | 3/2019 | Chen | |
| 2019/0267426 A1 | 8/2019 | Zou et al. | |
| 2020/0028044 A1* | 1/2020 | Lee | H01L 27/124 |

FOREIGN PATENT DOCUMENTS

| | | |
|---|---|---|
| CN | 105762112 A | 7/2016 |
| CN | 109478580 A | 3/2019 |
| CN | 109742099 A | 5/2019 |
| CN | 109904080 A | 6/2019 |

* cited by examiner

*Primary Examiner* — Ratisha Mehta
(74) *Attorney, Agent, or Firm* — The Webb Law Firm

(57) ABSTRACT

The present disclosure provides a driving backplane, a method for manufacturing the same, and a display device. The driving backplane includes: a substrate; and a bonding layer located on a side of the substrate and configured to bond with a plurality of Micro LEDs arranged in an array, wherein the bonding layer comprises a bonding metal layer and a conductive protection layer that are stacked sequentially along a direction away from the substrate, an orthographic projection of the conductive protection layer on the substrate substantially coinciding with an orthographic projection of the bonding metal layer on the substrate.

16 Claims, 3 Drawing Sheets

DRIVING BACKPLANE, METHOD FOR MANUFACTURING THE SAME, AND DISPLAY DEVICE

CROSS-REFERENCE TO RELATED APPLICATION

This application claims priority to Chinese Patent Application No. 201910753290.X filed Aug. 15, 2019, the disclosure of which is hereby incorporated by reference in its entirety.

TECHNICAL FIELD

The present disclosure relates to the technical field of display, and especially to a driving backplane, a method for manufacturing the same, and a display device.

BACKGROUND

Micro LED (Light Emitting Diode) technology relates to the structural designs of filmed, miniaturized and arrayed LEDs. The size of a Micro LED is about 1~10 μm. The manufacturing process of a Micro LED display device comprises: first, forming an arrayed Micro LED film on a transition substrate; next, transferring the arrayed Micro LED film to a driving backplane using the transition substrate, so that Micro LEDs are bonded with bonding units of the driving backplane in one-to-one correspondence; and then, forming a packaging process.

SUMMARY

According to one aspect of the embodiments of the present disclosure, a driving backplane is provided. The driving backplane comprises a substrate, and a bonding layer located on a side of the substrate and configured to bond with a plurality of Micro LEDs arranged in an array, wherein the bonding layer comprises a bonding metal layer and a conductive protection layer that are stacked sequentially along a direction away from the substrate, an orthographic projection of the conductive protection layer on the substrate substantially coinciding with an orthographic projection of the bonding metal layer on the substrate.

In some embodiments, the driving backplane further comprises a TFT layer, a first trace layer connected to the TFT layer, a first planarizing layer, a second trace layer connected to the first trace layer through a first via structure and connected to the bonding metal layer through a second via structure, and a second planarizing layer, which are located between the substrate and the bonding layer and sequentially arranged along the direction away from the substrate.

In some embodiments, the bonding layer comprises a plurality of bonding units arranged in an array, each of the bonding units being configured to bond with one of the Micro LEDs and comprising two electrode bonding portions, orthographic projections of the two electrode bonding portions on the substrate being spaced apart; and the driving backplane further comprises a protruded pattern layer located between the second planarizing layer and the bonding layer, the protruded pattern layer comprising a plurality of protrusion units arranged in an array, an orthographic projection of each of the protrusion units on the substrate partially overlapping with orthographic projections of the two electrode bonding portions on the substrate.

In some embodiments, the driving backplane further comprises a first insulating layer located between the first planarizing layer and the second trace layer; and a second insulating layer located between the second planarizing layer and the protruded pattern layer.

In some embodiments, the driving backplane further comprises a third trace layer, a third insulating layer, and a resistance layer connected to the third trace layer through a third via structure, which are located on a side of the substrate away from the bonding layer and sequentially arranged along a direction away from the substrate.

In some embodiments, the driving backplane further comprises an alignment mark layer located on a surface of the substrate away from the bonding layer.

In some embodiments, the bonding metal layer is a single metal layer.

In some embodiments, the bonding metal layer is a composite metal layer.

In some embodiments, the bonding metal layer comprises a first titanium layer, an aluminum layer, and a second titanium layer that are sequentially arranged along the direction away from the substrate.

In some embodiments, the bonding metal layer comprises a first molybdenum layer, an aluminum layer, and a second molybdenum layer that are sequentially arranged along the direction away from the substrate.

In some embodiments, a material of the conductive protection layer comprises indium tin oxide or indium zinc oxide.

In some embodiments, a material of the resistance layer comprises indium tin oxide or indium zinc oxide; and a material of the alignment mark layer comprises indium tin oxide or indium zinc oxide.

In some embodiments, the bonding metal layer, the first trace layer, the second trace layer, and the third trace layer are made of the same material.

According to another aspect of the embodiments of the present disclosure, a display device is provided. The display device comprises the driving backplane according to any one of the preceding embodiments, and a plurality of Micro LEDs arranged in an array, bonded with the bonding layer of the driving backplane.

According to still another aspect of the embodiments of the present disclosure, a method for manufacturing a driving backplane is provided. The method comprises:

forming a pattern of a bonding layer on a side of a substrate through a single mask process, the bonding layer being configured to bond with a plurality of Micro LEDs arranged in an array; wherein the bonding layer comprises a bonding metal layer and a conductive protection layer that are stacked sequentially along a direction away from the substrate, an orthographic projection of the conductive protection layer on the substrate substantially coinciding with an orthographic projection of the bonding metal layer on the substrate.

In some embodiments, the forming a pattern of a bonding layer on a side of a substrate through a single mask process comprises:

sequentially forming a bonding metal film and a transparent conductive material film on the side of the substrate;

forming an etching mask on a side of the transparent conductive material film away from the substrate;

etching the transparent conductive material film through the etching mask to form a pattern of the conductive protection layer; and etching the bonding metal film through the etching mask to form a pattern of the bonding metal layer.

In some embodiments, the etching the transparent conductive material film comprises performing a wet-etching process on the transparent conductive material film; and the etching the bonding metal film comprises performing a dry-etching process on the bonding metal film.

In some embodiments, a material of the transparent conductive material film comprises indium tin oxide or indium zinc oxide.

In some embodiments, the forming a bonding metal film comprises sequentially forming a first titanium layer, an aluminum layer, and a second titanium layer on the side of the substrate.

In some embodiments, the forming a bonding metal film comprises sequentially forming a first molybdenum layer, an aluminum layer, and a second molybdenum layer on the side of the substrate.

Other features, aspects and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure can be understood more clearly from the following detailed description with reference to the accompanying drawings, in which.

Figure 1:
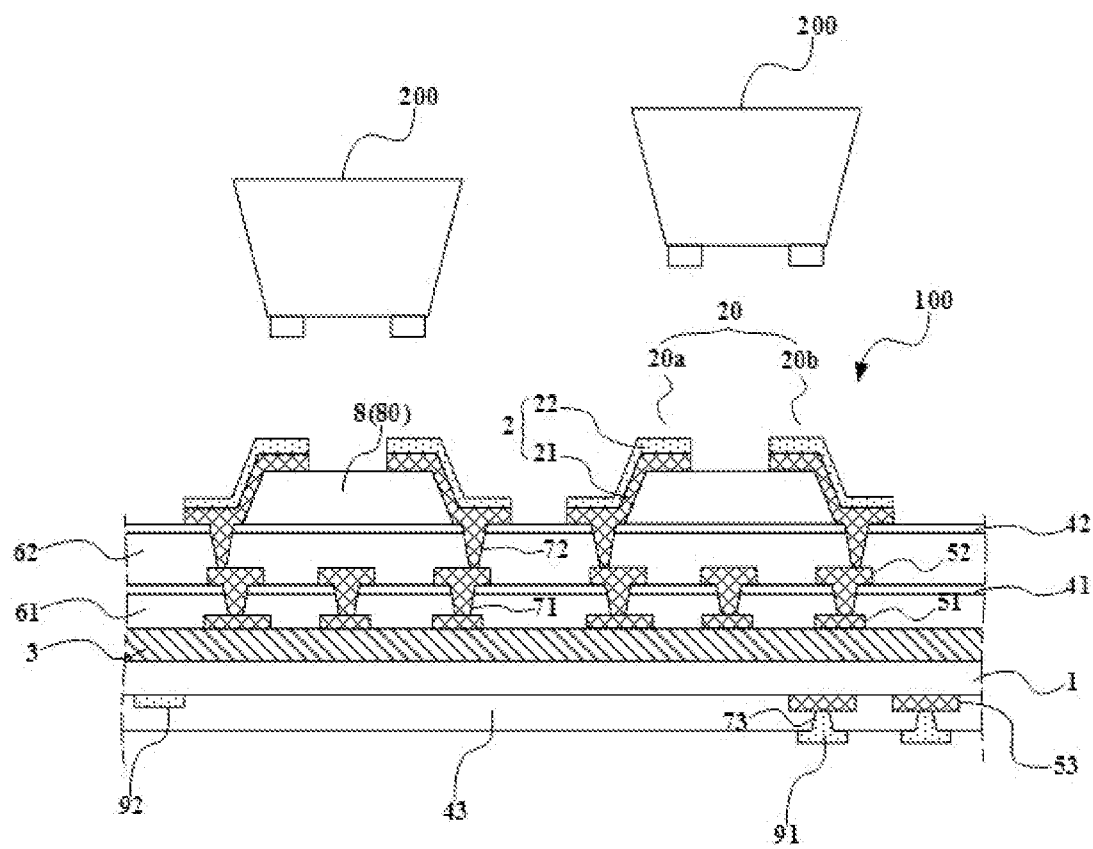
FIG. 1 is a schematic cross-sectional structure view of a driving backplane according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific element is arranged between a first element and a second element, there may be an intervening element between the specific element and the first element or the second element, or there may be no intervening element.

Unless otherwise defined, all terms (comprising technical and scientific terms) used herein have the same meaning as commonly understood by one of ordinary skill in the art to which exemplary embodiments in accordance with principles of inventive concepts belong. It will also be understood that terms defined in such general-purpose dictionaries should be interpreted as having a meaning that is consistent with their meaning in the context of the relevant art, and not to be interpreted in an idealized or overly formal sense, unless explicitly defined herein.

Techniques, methods, and apparatus known to those of ordinary skill in the relevant art may not be discussed in detail, but where appropriate, these techniques, methods, and apparatuses should be considered as part of the specification.

The inventors have noticed that a driving backplane of a Micro LED display device in the related art has a complicated manufacturing process. Its manufacturing cost is high, and the driving power consumption is not ideal.

The embodiments of the present disclosure provide a driving backplane, a method for manufacturing the same, and a display device, so as to simplify the manufacturing process of the driving backplane, and reduce the manufacturing cost and the driving power consumption. In the embodiments of the present disclosure, "connection" refers to electrical connection.

FIG. 1 shows a schematic cross-sectional structure view of a driving backplane according to an embodiment of the present disclosure.

As shown in FIG. 1, the driving backplane 100 comprises a substrate 1 and a bonding layer 2 located on a side of the substrate 1. The bonding layer 2 is configured to bond with a plurality of Micro LEDs 200 arranged in an array. The bonding layer 2 comprises a plurality of bonding units 20 arranged in an array. In FIG. 1, only two Micro LEDs 200 and two bonding units 20 are shown. Each bonding units 20 is configured to bond with a Micro LEDs 200, and comprises two electrode bonding portions 20a and 20b. The orthographic projections of the two electrode bonding portions 20a and 20b on the substrate 1 are spaced apart.

As shown in FIG. 1, the bonding layer 2 comprises a bonding metal layer 21 and a conductive protection layer 22 that are stacked sequentially along a direction away from the substrate 1. The orthographic projection of the conductive protection layer 22 on the substrate 1 substantially coinciding with the orthographic projection of the bonding metal layer 21 on the substrate 1.

In the present disclosure, 'substantially coincide' means the orthographic projections of the conductive protection layer 22 and the bonding metal layer 21 on the substrate 1 are coincident within a manufacturing error range. For example, more than 95% of the area of the orthographic projection of the conductive protection layer 22 on the substrate 1 overlaps with more than 95% of the area of the orthographic projection of the bonding metal layer 21 on the substrate overlap, then the orthographic projections of the conductive protection layer 22 and the bonding metal layer 21 on the substrate 1 are considered to be coincident.

As shown in FIG. 1, the bonding unit 20 serves as a driving electrode of the Micro LED 200. The two electrode bonding portions 20a and 20b are spaced apart from each other and connected to circuits of the driving backplane 100. The two electrode bonding portions 20a and 20b are respectively bonded with a positive electrode and a negative electrode of the Micro LED 200 when batches of Micro LEDs 200 are transferred to the driving backplane 100 using a transition substrate.

The bonding layer 2 comprises a bonding metal layer 21 and a conductive protection layer 22 that are stacked. In some embodiments, the bonding metal layer 21 is a single metal layer. In other embodiments, the bonding metal layer 21 is a composite metal layer comprising a plurality of metal sublayers.

In some embodiments, the bonding metal layer 21 is a composite metal layer comprising a first titanium layer, an aluminum layer, and a second titanium layer that are sequentially arranged along the direction away from the substrate 1. In other embodiments, the bonding metal layer 21 is a composite metal layer comprising a first molybdenum layer, an aluminum layer, and a second molybdenum layer that are sequentially arranged along the direction away from the substrate 1. The conductive protection layer 22 is located on a side of the bonding metal layer 21 away from the substrate 1. The conductive protection layer 22 can protect the bonding metal layer 21 from being oxidized while used for conducting electricity. The specific material of the conductive protection layer 22 comprises but not limited to, indium tin oxide or indium zinc oxide.

The inventors have noticed that, in the manufacturing process of a driving backplane in the related art, patterns of the conductive protection layer and the bonding metal layer are respectively formed by a mask process, which is complicated and may cause pattern misalignment.

In the embodiments of the present disclosure, as shown in FIG. 1, the conductive protection layer 22 and the bonding metal layer 21 are stacked and the orthographic projections of the conductive protection layer 22 and the bonding metal layer 21 on the substrate 1 substantially coincide with each other, that is, the patterns of the conductive protection layer 22 and the bonding metal layer 21 are substantially the same. Thus, the patterns of the conductive protection layer 22 and the bonding metal layer 21 can be formed in one single mask process using only one mask, and there is no need for alignment between the two patterns, and thereby no alignment deviation occurs. Therefore, the manufacturing process of the driving backplane 100 can be simplified, and the manufacturing cost can be reduced.

In addition, since the patterns of the conductive protection layer 22 and the bonding metal layer 21 are substantially the same, and there is no misalignment between the two patterns, so that the stacked contact area is maximized, and the contact resistance between the conductive protection layer 22 and the bonding metal layer 21 is reduced. Thereby, the driving power consumption of the driving backplane 100 is reduced. Contact resistance refers to the resistance present between two conductors in contact.

In some embodiments of the present disclosure, in addition to the substrate 1 and the bonding layer 2 described above, the driving backplane 100 further comprises a TFT (Thin Film Transistor) layer 3, a first trace layer 51 connected to the TFT layer 3, a first planarizing layer 61, a second trace layer 52 connected to the first trace layer 51 through a first via structure 71 and connected to the bonding metal layer 21 through a second via structure 72, and a second planarizing layer 62, which are located between the substrate 1 and the bonding layer 2 and sequentially arranged along the direction away from the substrate 1.

The TFT layer 3 comprises a plurality of TFTs arranged in an array. Each TFT is correspondingly provided for a Micro LED 200, and serves as a switching device for controlling the lighting state of the Micro LED 200. A VSS signal as a common ground voltage signal of the driving backplane 100 is transmitted to the Micro LED 200 after sequentially passing through a part of the first trace layer 51 and a part of the second trace layer 52. A VDD signal as a working voltage signal of the driving backplane 100 is transmitted to the TFT layer 3 after sequentially passing through a part of the second trace layer 52 and a part of the first trace layer 51.

The first planarizing layer 61 is used for planarizing a step difference caused by the first trace layer 51, so as to provide a relatively flat or planarized surface for subsequent production of other layers. The second planarizing layer 62 is used for planarizing a step difference caused by the second trace layer 52, so as to provide a relatively flat or planarized surface for subsequent production of other layers.

In some embodiments, the first planarizing layer 61 and the second planarizing layer 62 comprise an organic material such as resin. As for the materials of the first trace layers 51 and the second trace layers 52, the bonding metal layer 21 can be referred to. In some embodiments, the materials of the first trace layers 51, the second trace layers 52, and the bonding metal layer 21 are the same.

As shown in FIG. 1, in some embodiments of the present disclosure, the driving backplane 100 further comprises a protruded pattern layer 8 located between the second planarizing layer 62 and the bonding layer 2. The protruded pattern layer 8 comprises a plurality of protrusion units 80 arranged in an array. The orthographic projection of each protrusion unit 80 on the substrate 1 partially overlaps with the orthographic projections of the two electrode bonding portions 20a and 20b on the substrate 1. That is, the protrusion unit 80 partially raises the two electrode bonding portions 20a and 20b to make them convex. This design can improve the contact between the Micro LED 200 and the bonding unit 20 and ensure their bonding force when batches of Micro LEDs 200 are transferred to the driving backplane 100 using a transition substrate. Thereby the bonding reliability between the Micro LED 200 and the bonding unit 20 is ensured. In some embodiments, the material of the protruded pattern layer 8 is a resin.

In some embodiments of the present disclosure, the driving backplane 100 further comprises a first insulating layer 41 located between the first planarizing layer 61 and the second trace layer 52, and a second insulating layer 42 located between the second planarizing layer 62 and the protruded pattern layer 8. The insulating layer can protect the planarizing layer and prevent subsequent processes from damaging the surface of the planarizing layer, such as preventing a sputtering process from damaging the surface of the planarizing layer during the process of making a trace layer. In some embodiments, the first insulating layer 41 and the second insulating layer 42 comprise an inorganic insulating material such as silicon nitride.

Referring to FIG. 1, in some embodiments of the present disclosure, the driving backplane 100 further comprises a third trace layer 53, a third insulating layer 43, and a resistance layer 91 connected to the third trace layer 53 through the third via structure 73, which are located on a side of the substrate 1 away from the bonding layer 2 and sequentially arranged along a direction away from the substrate 1.

In order to reduce the area occupied by the trace structure in the non-display area of the driving backplane 100, thereby reducing the border width of the frame of the display device, a third trace layer 53 that is a part of the circuits is arranged on a side of the substrate 1 away from the bonding layer 2. That is, the third trace layer 53 is arranged on the back side of the substrate 1. In some embodiments, the third trace layer 53 is connected to the traces on the front side of the substrate 1 through a trace structure arranged at the edge of the driving backplane 100. As for the material of the third trace layer 53, the material of the bonding metal layer 21 can be referred to. In some embodiments, the material of the third trace layer 53 and the material of the bonding metal layer 21 are the same. The resistance layer 91 is connected to the third trace layer 53 through the third via structure 73 on the third insulation layer 43. This is equivalent to a parallel connection of resistances, which can reduce the resistance of the traces and further reduce power consumption of the driving backplane 100. The patterns of the resistance layer 91 and the third trace layer 53 may be the same or different. In some embodiments, the resistance layer 91 comprises a material such as indium tin oxide or indium zinc oxide. The third insulating layer 43 comprises an inorganic insulating material such as silicon nitride.

In addition, the driving backplane 100 further comprises an alignment mark layer 92 located on a surface of the substrate 1 away from the bonding layer 2.

The alignment mark layer 92 comprises at least one alignment mark. The alignment mark layer 92 is formed on the back surface of the substrate 1 after the formation of the layer structure on the front side of the substrate 1 is completed. The alignment mark can be used as an alignment reference for the formation of a subsequent layer structure. For example, an alignment mark is used as an alignment reference when forming the third trace layer 53. In some embodiments, the alignment mark layer 92 comprises a transparent material such as indium tin oxide or indium zinc oxide, which has a small influence on the overall appearance of the driving backplane 100.

An embodiment of the present disclosure also provides a method for manufacturing the driving backplane. The method comprises:

forming a pattern of a bonding layer on a side of a substrate through a single mask process, the bonding layer being configured to bond with a plurality of Micro LEDs arranged in an array, wherein the bonding layer comprises a bonding metal layer and a conductive protection layer that are stacked sequentially along a direction away from the substrate, an orthographic projection of the conductive protection layer on the substrate substantially coinciding with an orthographic projection of the bonding metal layer on the substrate.

In some embodiments, the forming a pattern of a bonding layer on a side of a substrate through a single mask process comprises:

sequentially forming a bonding metal film and a transparent conductive material film on the side of the substrate;

forming an etching mask on a side of the transparent conductive material film away from the substrate;

etching the transparent conductive material film through the etching mask to form a pattern of the conductive protection layer; and etching the bonding metal film through the etching mask to form a pattern of the bonding metal layer.

Figure 2:
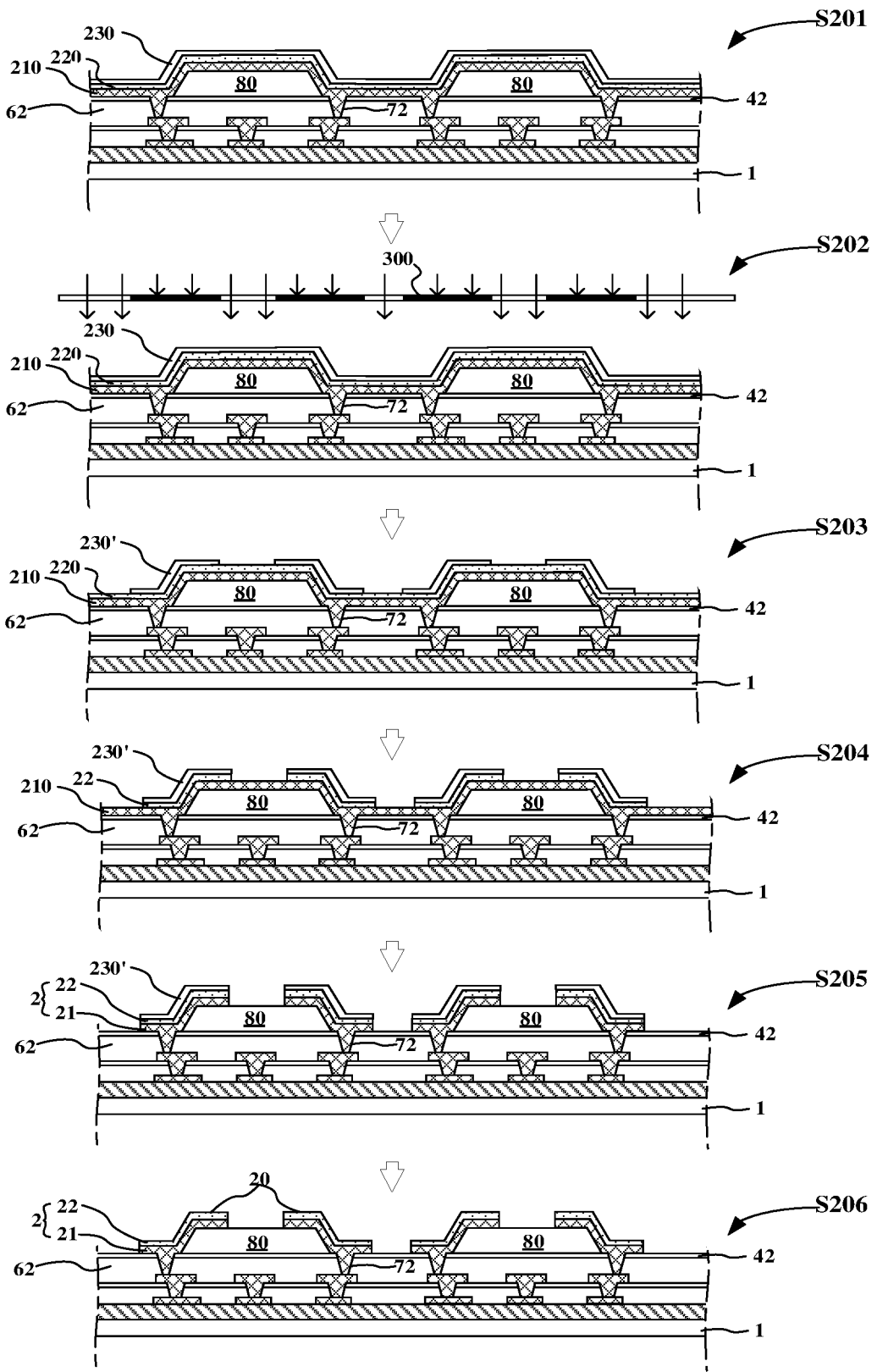
FIG. 2 is a schematic view of a process for forming a bonding layer of the driving backplane according to an embodiment of the present disclosure.

As shown in FIG. 2, in one embodiment, forming the pattern of the bonding layer comprises the following steps S201 to S206.

In step S201, a bonding metal film 210, a transparent conductive material film 220, and a photoresist film 230 are sequentially formed on a side of the substrate 1.

In step S202, the photoresist film 230 is exposed using a mask 300.

In step S203, the exposed photoresist film 230 is developed, and an etching mask 230' is formed in the region where the bonding units 20 are to be formed.

In step S204, the transparent conductive material film 220 is etched through the etching mask 230' to form a pattern of the conductive protection layer 22.

In step S205, the bonding metal film 210 is etched through the etching mask 230' to form a pattern of the bonding metal layer 21.

In step S206, the etching mask 230' on the surface of the conductive protection layer 22 is removed.

In one embodiment of the present disclosure, in step S201, forming a bonding metal film 210 comprises sequentially forming a first titanium layer, an aluminum layer, and a second titanium layer on the side of the substrate 210.

In another embodiment of the present disclosure, in step S201, forming a bonding metal film 210 comprises sequentially forming a first molybdenum layer, an aluminum layer, and a second molybdenum layer on the side of the substrate 210.

The material of the transparent conductive material film 220 comprises indium tin oxide or indium zinc oxide.

In an embodiment of the present disclosure, in step S204, the transparent conductive material film 220 is etched in a wet-etching process. The principle of wet-etching is to strip the material to be etched through a chemical reaction between a chemical etching solution and an etched film layer. The molecular structure of the transparent conductive material film that comprises indium tin oxide or indium zinc oxide is relatively loose, so that the wet etching process will not damage the surface structure of the conductive protection layer. Besides, the cost of the wet etching process is low, and the wet etching efficiency is high.

In an embodiment of the present disclosure, in step S205, the bonding metal film 210 is etched in a dry-etching process. The principle of dry-etching is that the material to be etched is volatilized or corroded by a reaction between plasma and the etched film layer. It is easy to adjust the etching speed of each sublayer of the bonding metal film 210 in a dry-etching process, so that the accuracy of the etching is high, and the etching anisotropy is good.

Figure 3:
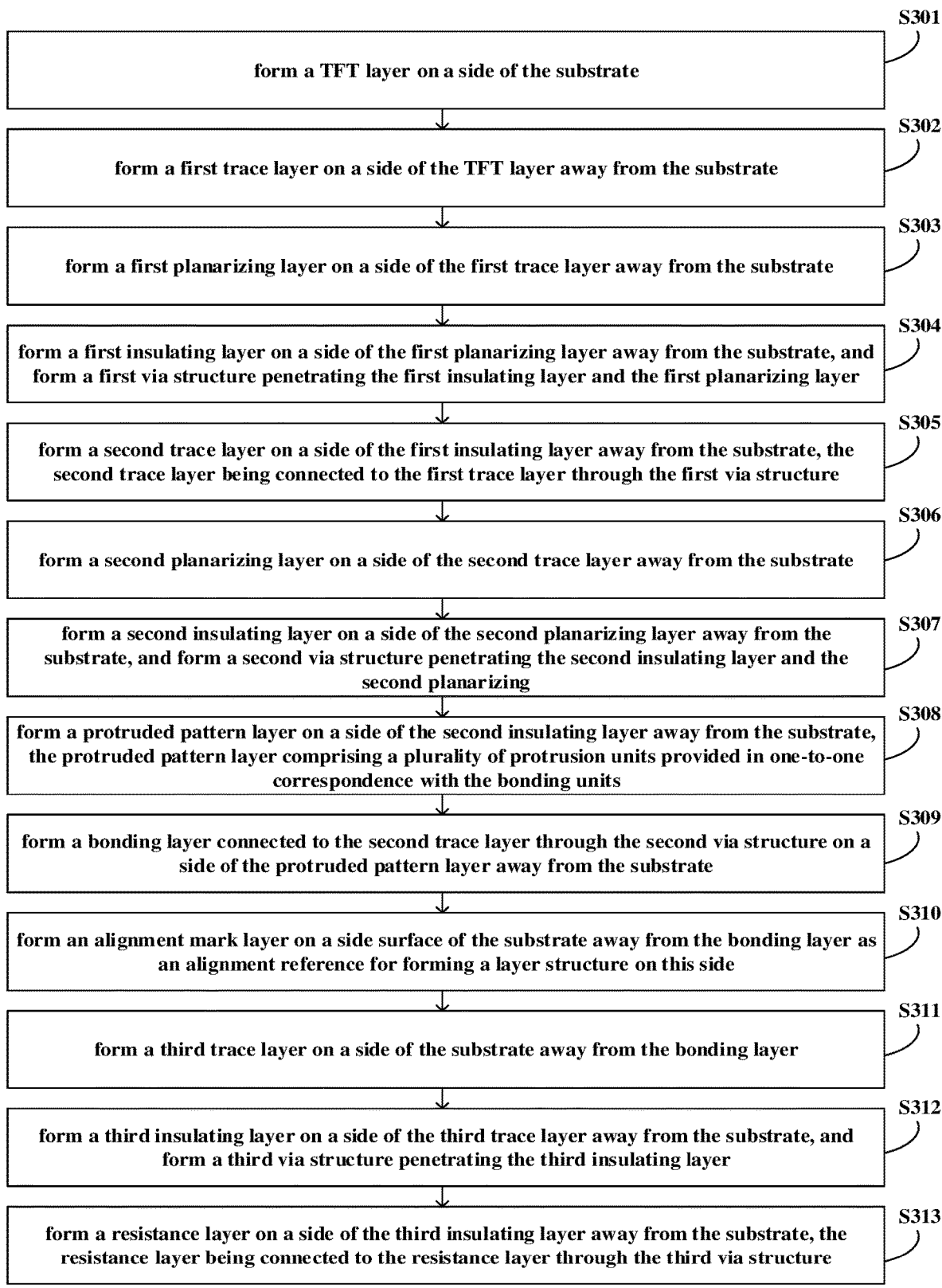
FIG. 3 is a flowchart of a method for manufacturing the driving backplane according to an embodiment of the present disclosure.

FIG. 3 is a flowchart of a method for manufacturing the driving backplane shown in FIG. 1 according to an embodiment of the present disclosure. The method comprises the following steps S301 to S313.

In step S301, a TFT layer is formed on a side of the substrate.

In step S302, a first trace layer is formed on a side of the TFT layer away from the substrate.

In step S303, a first planarizing layer is formed on a side of the first trace layer away from the substrate.

In step S304, a first insulating layer is formed on a side of the first planarizing layer away from the substrate, and a first via structure penetrating the first insulating layer and the first planarizing layer is formed.

In step S305, a second trace layer is formed on a side of the first insulating layer away from the substrate, and the second trace layer is connected to the first trace layer through the first via structure.

In step S306, a second planarizing layer is formed on a side of the second trace layer away from the substrate.

In step S307, a second insulating layer is formed on a side of the second planarizing layer away from the substrate, and a second via structure penetrating the second insulating layer and the second planarizing layer is formed.

In step S308, a protruded pattern layer is formed on a side of the second insulating layer away from the substrate. The protruded pattern layer comprises a plurality of protrusion units provided in one-to-one correspondence with the bonding units.

In step S309, a bonding layer connected to the second trace layer through the second via structure is formed on a side of the protruded pattern layer away from the substrate. The above steps S201-S206 can be referred to when performing the step S309.

In step S310, an alignment mark layer is formed on a surface of the substrate away from the bonding layer as an alignment reference for forming a layer structure on this side.

In step S311, a third trace layer is formed on a side of the substrate away from the bonding layer.

In step S312, a third insulating layer is formed on a side of the third trace layer away from the substrate, and a third via structure penetrating the third insulating layer is formed.

In step S313, a resistance layer is formed on a side of the third insulating layer away from the substrate, and the resistance layer is connected to the resistance layer through the third via structure.

By using the method of the embodiments of the present disclosure, the patterns of the conductive protection layer and the bonding metal layer are formed in one single mask process, which can simplify the manufacturing process, reduce the manufacturing cost, and reduce the power consumption of the driving backplane.

An embodiment of the present disclosure further provides a display device comprising the driving backplane of any one of the foregoing embodiments, and a plurality of Micro LEDs arranged in an array and bonded with the bonding units of the driving backplane.

Since the driving backplane has the beneficial effects described above, the manufacturing efficiency of the display device is high, the manufacturing cost of the display device is low, and the driving power consumption of the display device is also low. The specific type of the display device comprises but not limited to, a display, a tablet computer, a television, an electronic paper, or a display screen, etc.

Although some specific embodiments of the present disclosure have been described in detail by way of example, those skilled in the art should understand that the above examples are only for the purpose of illustration and are not intended to limit the scope of the present disclosure. It should be understood by those skilled in the art that the above embodiments may be modified without departing from the scope and spirit of the present disclosure. The scope of the disclosure is defined by the following claims.

What is claimed is:

1. A driving backplane, comprising:
    a substrate;
    a bonding layer located on a side of the substrate and configured to bond with a plurality of Micro LEDs arranged in an array, wherein the bonding layer comprises a bonding metal layer and a conductive protection layer that are stacked sequentially along a direction away from the substrate, an orthographic projection of the conductive protection layer on the substrate substantially coinciding with an orthographic projection of the bonding metal layer on the substrate; and
    a TFT layer, a first trace layer connected to the TFT layer, a first planarizing layer, a second trace layer connected to the first trace layer through a first via structure and connected to the bonding metal layer through a second via structure, and a second planarizing layer, which are located between the substrate and the bonding layer and sequentially arranged along the direction away from the substrate.

2. The driving backplane according to claim 1, wherein the bonding layer comprises a plurality of bonding units arranged in an array, each of the bonding units being configured to bond with one of the Micro LEDs and comprising two electrode bonding portions, orthographic projections of the two electrode bonding portions on the substrate being spaced apart; and
    the driving backplane further comprises a protruded pattern layer located between the second planarizing layer and the bonding layer, the protruded pattern layer comprising a plurality of protrusion units arranged in an array, an orthographic projection of each of the protrusion units on the substrate partially overlapping with orthographic projections of the two electrode bonding portions on the substrate.

3. The driving backplane according to claim 2, further comprising:
    a first insulating layer located between the first planarizing layer and the second trace layer; and
    a second insulating layer located between the second planarizing layer and the protruded pattern layer.

4. The driving backplane according to claim 3, further comprising:
    a third trace layer, a third insulating layer, and a resistance layer connected to the third trace layer through a third via structure, which are located on a side of the substrate away from the bonding layer and sequentially arranged along a direction away from the substrate.

5. The driving backplane according to claim 4, further comprising:
    an alignment mark layer located on a surface of the substrate away from the bonding layer.

6. The driving backplane according to claim 5, wherein:
    a material of the resistance layer comprises indium tin oxide or indium zinc oxide; and
    a material of the alignment mark layer comprises indium tin oxide or indium zinc oxide.

7. The driving backplane according to claim 4, wherein the bonding metal layer, the first trace layer, the second trace layer, and the third trace layer are made of the same material.

8. The driving backplane according to claim 1, wherein the bonding metal layer is a single metal layer.

9. The driving backplane according to claim 1, wherein the bonding metal layer is a composite metal layer.

10. The driving backplane according to claim 1, wherein a material of the conductive protection layer comprises indium tin oxide or indium zinc oxide.

11. A display device, comprising:
    the driving backplane according to claim 1; and
    a plurality of Micro LEDs arranged in an array bonded with the bonding layer of the driving backplane.

12. A driving backplane, comprising:
    a substrate;
    a bonding layer located on a side of the substrate and configured to bond with a plurality of Micro LEDs arranged in an array, wherein the bonding layer comprises a bonding metal layer and a conductive protection layer that are stacked sequentially along a direction away from the substrate, an orthographic projection of the conductive protection layer on the substrate substantially coinciding with an orthographic projection of the bonding metal layer on the substrate, wherein the bonding metal layer is a composite metal layer and comprises a first titanium layer, an aluminum layer, and a second titanium layer that are sequentially arranged along the direction away from the substrate; or the bonding metal layer is a composite metal layer and comprises a first molybdenum layer, an aluminum layer, and a second molybdenum layer that are sequentially arranged along the direction away from the substrate.

13. A method for manufacturing a driving backplane, comprising:

forming a pattern of a bonding layer on a side of a substrate through a single mask process, the bonding layer being configured to bond with a plurality of Micro LEDs arranged in an array;

wherein the bonding layer comprises a bonding metal layer and a conductive protection layer that are stacked sequentially along a direction away from the substrate, an orthographic projection of the conductive protection layer on the substrate substantially coinciding with an orthographic projection of the bonding metal layer on the substrate, wherein the forming a bonding metal film comprises:

sequentially forming a first titanium layer, an aluminum layer, and a second titanium layer on the side of the substrate; or sequentially forming a first molybdenum layer, an aluminum layer, and a second molybdenum layer on the side of the substrate.

14. The method according to claim 13, wherein the forming a pattern of a bonding layer on a side of a substrate through a single mask process comprises:

sequentially forming a bonding metal film and a transparent conductive material film on the side of the substrate;

forming an etching mask on a side of the transparent conductive material film away from the substrate;

etching the transparent conductive material film through the etching mask to form a pattern of the conductive protection layer; and etching the bonding metal film through the etching mask to form a pattern of the bonding metal layer.

15. The method according to claim 14, wherein:

the etching the transparent conductive material film comprises performing a wet-etching process on the transparent conductive material film; and the etching the bonding metal film comprises performing a dry-etching process on the bonding metal film.

16. The method according to claim 15, wherein a material of the transparent conductive material film comprises indium tin oxide or indium zinc oxide.

* * * * *